United States Patent
Wood et al.

(10) Patent No.: US 8,547,178 B2
(45) Date of Patent: Oct. 1, 2013

(54) SINGLE-EVENT UPSET HARDENED RING OSCILLATOR

(75) Inventors: Neil E. Wood, Centreville, VA (US);
Patrick Fleming, Arlington, VA (US);
Andrew T. Kelly, Arlington, VA (US);
Bin Li, Chantilly, VA (US); Daniel M. Pirkl, Centreville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 136 days.

(21) Appl. No.: 13/267,925

(22) Filed: Oct. 7, 2011

(65) Prior Publication Data

US 2012/0154058 A1 Jun. 21, 2012

Related U.S. Application Data

(60) Provisional application No. 61/391,347, filed on Oct. 8, 2010.

(51) Int. Cl.
*H03K 3/03* (2006.01)

(52) U.S. Cl.
USPC ......... 331/57; 331/2; 331/46; 331/49; 331/50

(58) Field of Classification Search
USPC ................................. 331/2, 46, 49, 50, 51, 57
See application file for complete search history.

(56) References Cited

U.S. PATENT DOCUMENTS

| | | | | |
|---|---|---|---|---|
| 6,137,368 A | * | 10/2000 | Cho | 331/16 |
| 6,249,189 B1 | * | 6/2001 | Wu et al. | 331/18 |
| 6,310,523 B1 | * | 10/2001 | Chen et al. | 331/57 |
| 6,642,802 B2 | | 11/2003 | Knowles et al. | |

* cited by examiner

*Primary Examiner* — Joseph Chang
*Assistant Examiner* — Jeffrey Shin
(74) *Attorney, Agent, or Firm* — Yudell Isidore Ng Russell; Antony Ng; Daniel J. Long

(57) ABSTRACT

A ring oscillator is disclosed. The ring oscillator includes a first tri-path inverter, a second tri-path inverter and a third tri-path inverter. The second tri-path inverter is connected to the first tri-path inverter. The third tri-path inverter is connected to the first and second tri-path inverters to provide feedback for oscillations.

9 Claims, 4 Drawing Sheets

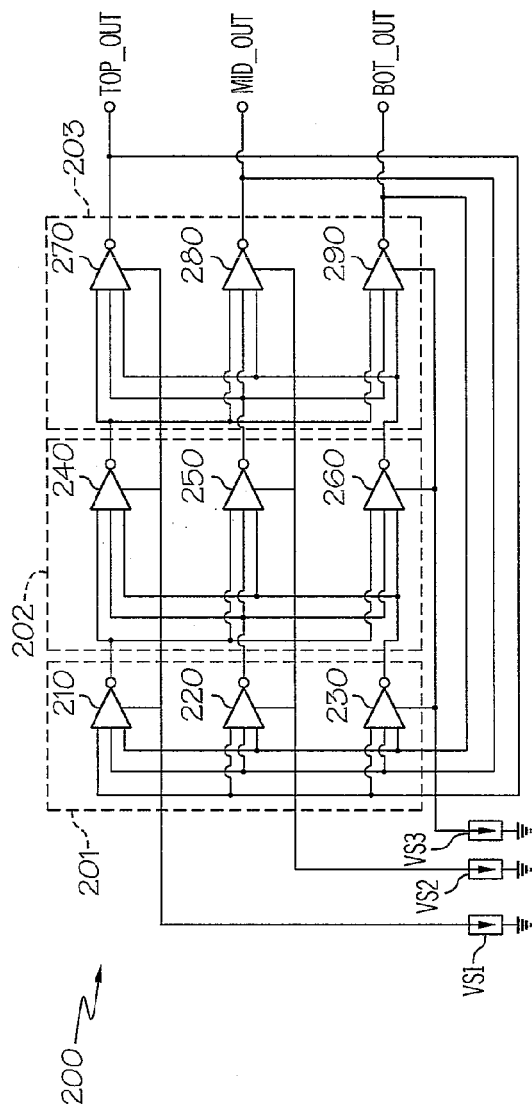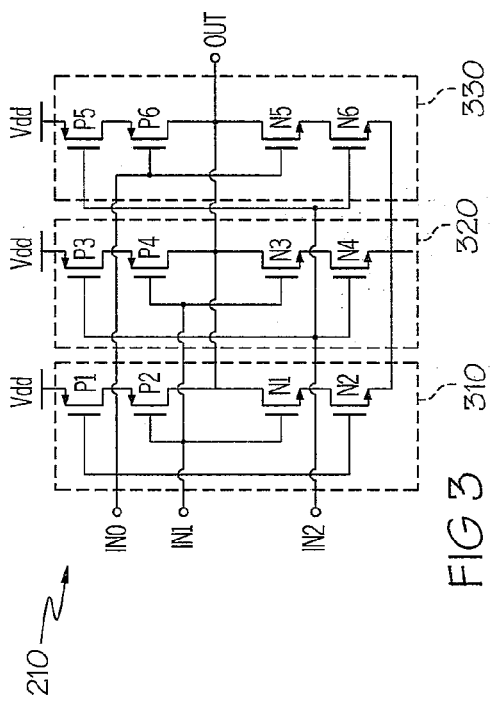

US 8,547,178 B2

SINGLE-EVENT UPSET HARDENED RING OSCILLATOR

PRIORITY CLAIM

The present application claims priority under 35 U.S.C. §119(e)(1) to provisional application No. 61/391,347 filed on Oct. 8, 2010, the contents of which are incorporated herein by reference.

STATEMENT OF GOVERNMENT INTEREST

The present invention was made with United States Government assistance under Contract No. NR0000-08-0358 awarded by the Naval Research Laboratory. The United States Government has certain rights in the present invention.

BACKGROUND OF THE INVENTION

1. Technical Field

The present invention relates to radiation-hardened circuits in general, and in particular to a single-event upset hardened ring oscillator.

2. Description of Related Art

When a high-energy particle impinges upon an integrated circuit (IC) device, the high-energy particle ionizes the regions of the IC device through which it travels. This ionization creates mobile charges in the vicinity of the high-energy particle's travel path, thereby generating a transient pulse, and the transient pulse may produce a Single Event Upset (SEU) within the IC device. An SEU may change critical data and/or alter the processing state of an IC device. Depending upon severity, an affected circuit or device may require a power reset in order to recover from an SEU.

Conventional ring oscillators are vulnerable to SEUs. An SEU is less likely to occur if the magnitude of its associated transient pulse is significantly less than the magnitude of regular signals within an IC device. Thus, one way to minimize SEU susceptibility is by using large-area devices that generally operate using larger magnitude signals. However, large-area devices consume more power and necessitate higher manufacturing costs.

Consequently, it would be desirable to provide an SEU hardened ring oscillator with minimal circuit redundancy, which can be manufactured by using conventional IC fabrication techniques.

SUMMARY OF THE INVENTION

In accordance with a preferred embodiment of the present invention, a ring oscillator includes a first tri-path inverter, a second tri-path inverter and a third tri-path inverter. The second tri-path inverter is connected to the first tri-path inverter. The third tri-path inverter is connected to the first and second tri-path inverters to provide feedback for oscillations.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 2 is a circuit diagram of a SEU hardened ring oscillator, in accordance with a preferred embodiment of the present invention;

FIG. 3 is a circuit diagram of a self-voting inverter within the SEU hardened ring oscillator from FIG. 2, in accordance with a preferred embodiment of the present invention;

DETAILED DESCRIPTION OF A PREFERRED EMBODIMENT

Figure 1:
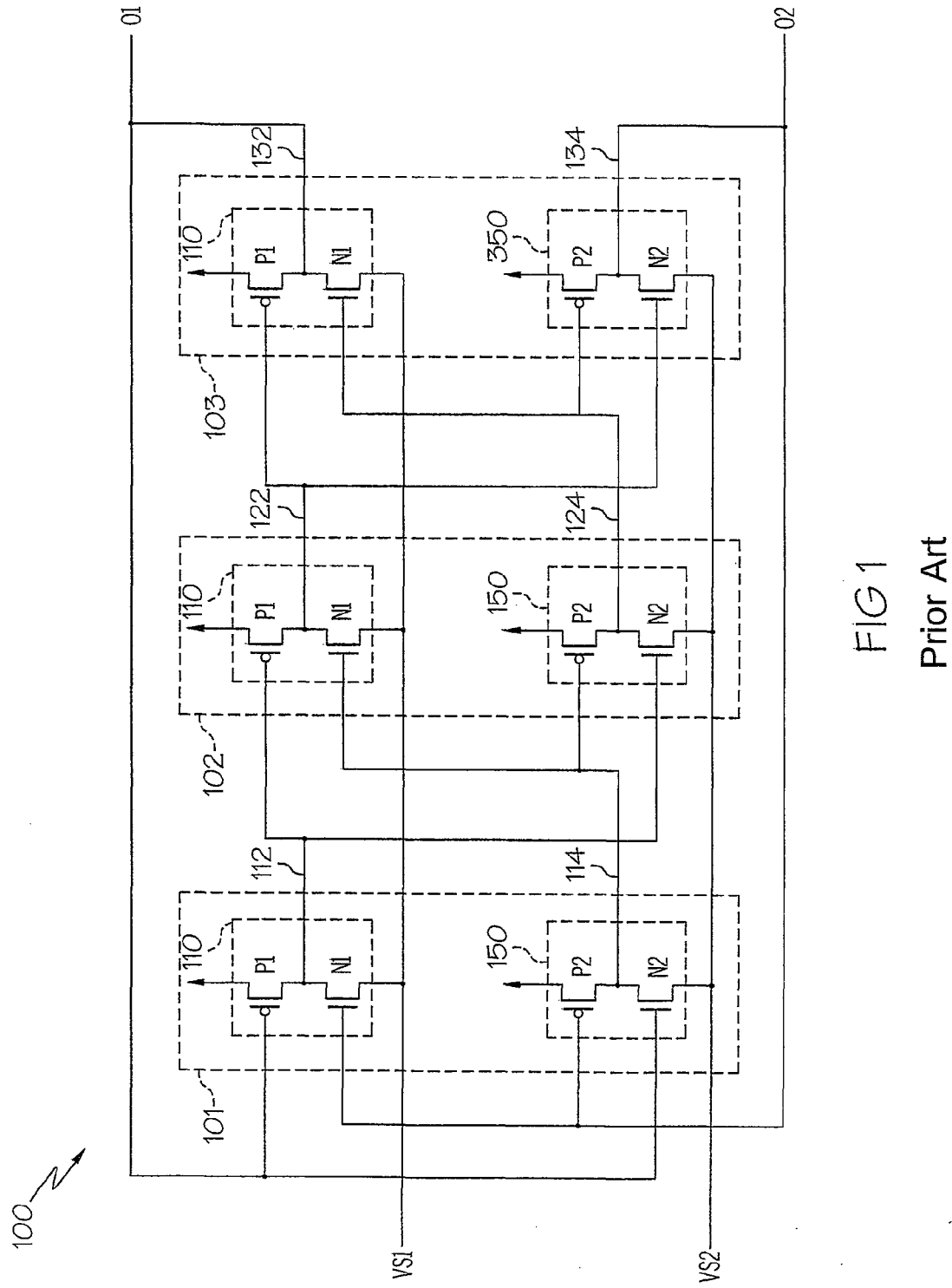
FIG. 1 is a circuit diagram of a conventional SEU hardened ring oscillator.

Referring now to the drawings and in particular to FIG. 1, there is illustrated a circuit diagram of a conventional single-event upset (SEU) hardened ring oscillator. As shown, a ring oscillator 100 includes a first dual-path inverter 101, a second dual-path inverter 102 and a third dual-path inverter 103. Each of first, second and third dual-path inverters 101, 102, 103 includes a first inverter 110 having a PMOS transistor P1 and a NMOS transistor N1 along with a second inverter 150 having a PMOS transistor P2 and a NMOS transistor N2. First dual-path inverter 101 includes a first output 112 and a second output 114, which are provided by first inverter 110 and second inverter 150, respectively. Similarly, second dual-path inverter 102 includes first and second outputs 122, 124; third dual-path inverter 103 includes first and second outputs 132, 134. Third dual-path inverter's first and second outputs 132, 134 also serve as first output O1 and second output O2 for ring oscillator 100.

Any given dual-path inverter's first output 112, 122, 132 is coupled to PMOS transistor P1 and NMOS transistor N2 of a subsequent dual-path inverter. Similarly, any given dual-path inverter's second output 114, 124, 134 is coupled to NMOS transistor N1 and PMOS transistor P2 of a subsequent dual-path inverter.

PMOS transistors P1, P2 within inverters 110, 150 are coupled to a positive power supply node. NMOS transistor N1 within inverter 110 is coupled to a first low-reference voltage VS1. Similarly, NMOS transistor N2 within inverter 150 is coupled to a second low-reference voltage VS2.

Ring oscillator 100 provides SEU immunity by ensuring that each of dual-path inverter 101-103 within ring oscillator 100 holds the correct logical state when its input values are different. In particular, if the input values to a dual-path inverter agree before an SEU event, the output values of the dual-path inverter will be the inverse logical equivalent of the input values. When an SEU event changes one of the input values of a dual-path inverter such that they no longer agree, one of the output values of the dual-path inverter still holds the correct logical state.

As an example, assume that the values at the inputs (i.e., nodes 112 and 114) of dual-path inverter 102 are both equal to a logic "0" before an SEU event, which means that both output values of dual-path inverter 102 equal to a logic "1" before an SEU event. When an SEU event occurs at node 112, it leads to a temporary value transition from a logic "0" to a logic "1." This results in a high impedance state equal to a logic "1" at node (output) 122, and a short circuit state between transistors P2 and N2. In this manner, the correct logic state is maintained at node 122.

Ring oscillator 100 provides excellent SEU immunity as long as all SEU events occur between rising and/or falling transitions on the input nodes to all dual-path inverters 101-103 within ring oscillator 100. Ring oscillator 100 fails to provide SEU immunity when an SEU event occurs on one of the input nodes during a rising and/or falling transition. When this occurs, ring oscillator 100 stops oscillating until noise restarts ring oscillator 100, and this leads to a large multi-bit (or multi-cycle) SEU.

With reference now to FIG. 2, there is depicted a circuit diagram of a SEU hardened ring oscillator, in accordance with a preferred embodiment of the present invention. As shown, a ring oscillator 200 includes a first tri-path inverter 201, a second tri-path inverter 202 and a third tri-path inverter 203. First tri-path inverter 201 includes a self-voting inverter 210, a self-voting inverter 220 and a self-voting inverter 230. Second tri-path inverter 202 includes a self-voting inverter 240, a self-voting inverter 250 and a self-voting inverter 260. Third tri-path inverter 203 includes a self-voting inverter 270, a self-voting inverter 280 and a self-voting inverter 290.

The output of self-voting inverter 210 is connected to first inputs of self-voting inverters 240, 250, 260. The output of self-voting inverter 220 is connected to second inputs of self-voting inverters 240, 250, 260. The output of self-voting inverter 230 is connected to third inputs of self-voting inverters 240, 250, 260.

The output of self-voting inverter 240 is connected to first inputs of self-voting inverters 270, 280, 290. The output of self-voting inverter 250 is connected to second inputs of self-voting inverters 270, 280, 290. The output of self-voting inverter 260 is connected to third inputs of self-voting inverters 270, 280, 290.

The output of self-voting inverter 270 is connected to first inputs of self-voting inverters 210, 220, 230. The output of self-voting inverter 280 is connected to second inputs of self-voting inverters 210, 220, 230. The output of self-voting inverter 290 is connected to third inputs of self-voting inverters 210, 220, 230. In addition, the output of self-voting inverter 270 serves as a first output Top_out for ring oscillator 200, the output of self-voting inverter 280 serves as a second output Mid_out for ring oscillator 200, and the output of self-voting inverter 290 serves as a third output Bot_out for ring oscillator 200. The couplings between first and third tri-path inverters 201, 203 provide feedback for oscillations in a manner that is well-known to those skilled in the art.

Each of self-voting inverters 210, 240, 270 is coupled to a first reference voltage VS1. Each of self-voting inverters 220, 250, 280 is coupled to a second reference voltage VS2. Each of self-voting inverters 230, 260, 290 is coupled to a third reference voltage VS3. If ring oscillator 200 is being implemented as a current starved voltage-controlled oscillator (VCO), then first reference voltage VS1, second reference voltage VS2 and third reference voltage VS3 will be replaced by corresponding current mirrors.

Ring oscillator 200 provides SEU immunity by ensuring that each of tri-path inverters 201-203 within ring oscillator 200 holds the correct logical state when at least two of its three inputs agree with each other. In particular, if the input values to a tri-path inverter agree before an SEU event, the output values of the tri-path inverter will be the inverse logical equivalent of the input values. When an SEU event changes one of the input values to the tri-path inverter such that one of the three input values disagrees with the other two input values, then all three output values will still hold the correct logical state.

Figure 4:
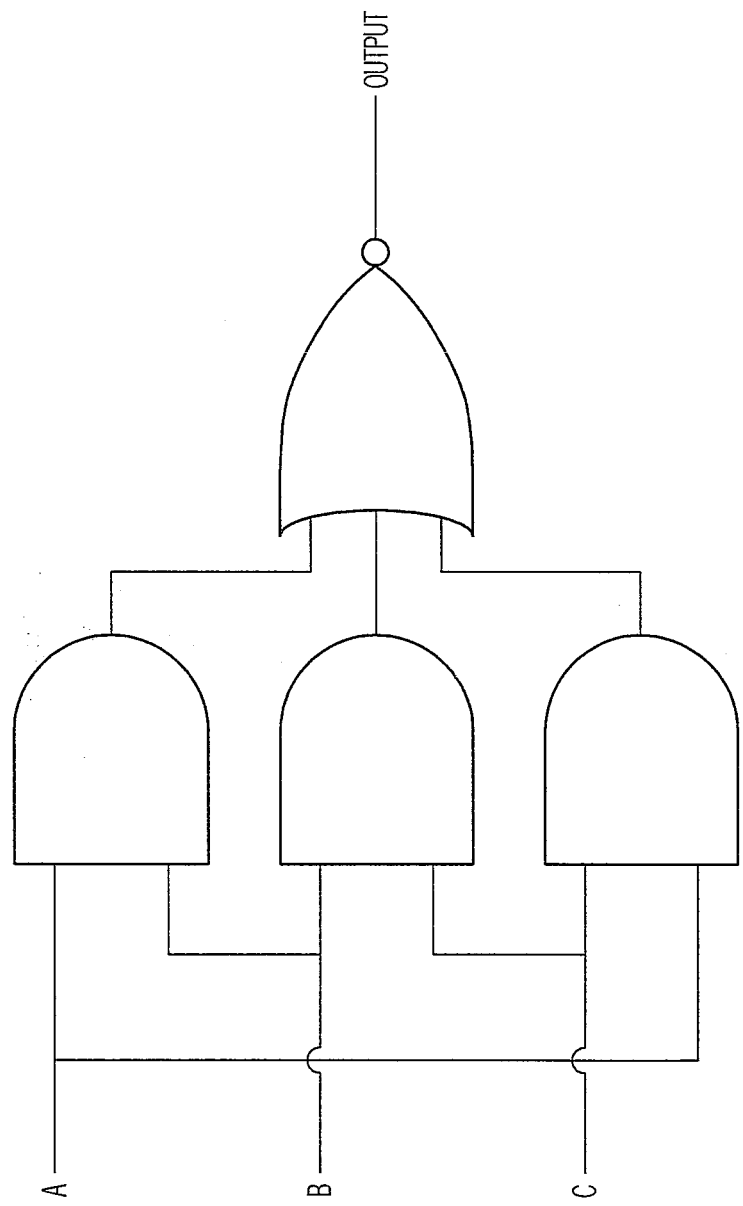
FIG. 4 is a logic diagram of a self-voting inverter, in accordance with a preferred embodiment of the present invention.

Each of tri-path inverters 201-203 provides the above-mentioned functionality by utilizing three self-voting inverters that use the same three inputs for each self-voting inverter in a given tri-path inverter, and use three separate outputs. Each self-voting inverter has the logical function of three two-input AND gates connected to a three-input NOR gate, as shown in FIG. 4. Each self-voting inverter can logically reject an erroneous data when two of its inputs agree, according to truth table I.

TABLE I

| A | B | C | Output |
|---|---|---|--------|
| 0 | 0 | 0 | 1 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

Since self-voting inverters 210-290 are substantially identical to each other, only self-voting inverter 210 will be further described in details. Referring now FIG. 3, there is illustrated a circuit diagram of self-voting inverter 210, in accordance with a preferred embodiment of the present invention. As shown, self-voting inverter 210 includes a first tri-state stage inverter 310, a second tri-state stage inverter 320 and a third tri-state stage inverter 330. First tri-state stage inverter 310 includes PMOS transistors P1, P2 and NMOS transistors N1, N2. Second tri-state stage inverter 320 includes PMOS transistors P3, P4 and NMOS transistors N3, N4. Third tri-state stage inverter 330 includes PMOS transistors P5, P6 and NMOS transistors N5, N6.

A first input In0 of self-voting inverter 210 is connected to PMOS transistors P1, P6 and NMOS transistors N2, N5. A second input In1 of self-voting inverter 210 is connected to PMOS transistors P2, P4 and NMOS transistors N1, N3. A third input In2 of self-voting inverter 210 is connected to PMOS transistors P3, P5 and NMOS transistors N4, N6. The output Out of self-voting inverter 210 is provided by the node between transistors P2, N1, the node between transistors P4, N3, and the node between transistors P6, N5.

PMOS transistors P1, P3 and P5 are connected to a high-reference voltage VDD. NMOS transistors N2, N4 and N6 are connected to a low-reference voltage such as VS1, VS2 or VS3 from FIG. 2.

Figure 5:
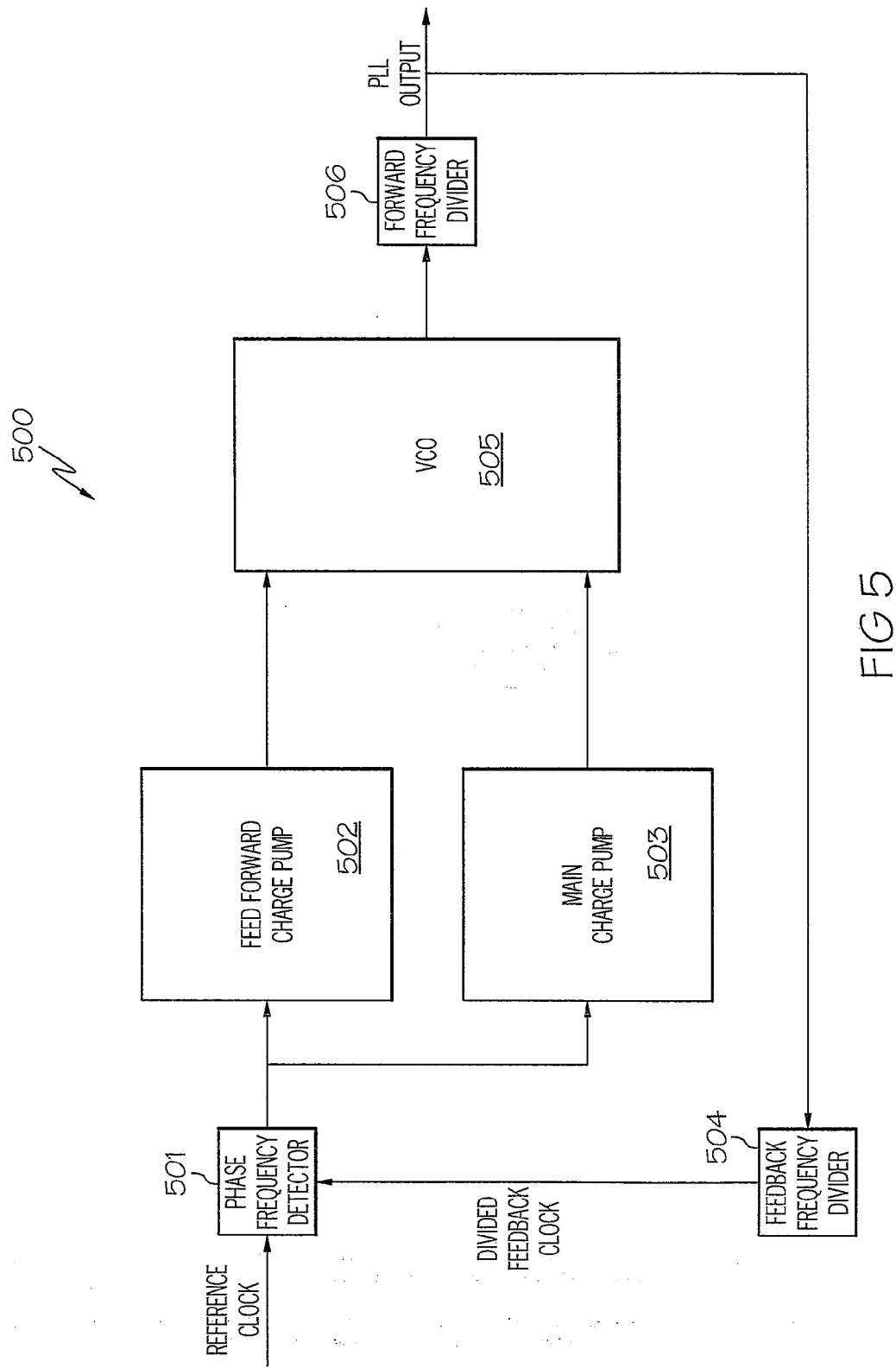
FIG. 5 is a block diagram of a phase-lock loop circuit in which the SEU hardened ring oscillator from FIG. 2 can be implemented, in accordance with a preferred embodiment of the present invention.

Ring oscillator 200 can be implemented as a current starved VCO for a phase-lock loop (PLL) circuit. Referring now to FIG. 5, there is a block diagram of a PLL circuit in which ring oscillator 200 is incorporated, in accordance with a preferred embodiment of the present invention. As shown, a PLL circuit 500 includes a phase frequency detector 501, a feedforward charge pump 502, a main charge pump 503, a VCO 505, a forward frequency divider 506 and a feedback frequency divider 504. Phase frequency detector 501 receives a clock signal from a reference clock. VCO 505 can be implemented with ring oscillator 200 (from FIG. 2) along with current mirrors. Forward frequency divider 506 provides output signals for PLL circuit 500.

As has been described, the present invention provides an SEU hardened ring oscillator.

While the invention has been particularly shown and described with reference to a preferred embodiment, it will be understood by those skilled in the art that various changes in form and detail may be made therein without departing from the spirit and scope of the invention.

What is claimed is:

1. A ring oscillator comprising:
    a first tri-path inverter having a first self-voting inverter, a second self-voting inverter and a third self-voting inverter;
    a second tri-path inverter connected to said first tri-path inverter, wherein said second tri-path inverter includes a fourth self-voting inverter, a fifth self-voting inverter and a sixth self-voting inverter; and
    a third tri-path inverter connected to said first and second tri-path inverters to provide feedback for oscillations, wherein said third tri-path inverter includes a seventh self-voting inverter, an eighth self-voting inverter and a ninth self-voting inverter.

2. The ring oscillator of claim 1, wherein said first, second and third tri-path inverters are structurally equivalent.

3. The ring oscillator of claim 1, wherein one of said tri-path inverters includes three inputs and three outputs.

4. The ring oscillator of claim 1, wherein said self-voting inverters are structurally equivalent.

5. The ring oscillator of claim 1, wherein one of said self-voting inverters includes three stages.

6. The ring oscillator of claim 5, wherein one of said stages includes two PMOS transistors connected in series with two NMOS transistors.

7. A phase-lock loop circuit comprising:
    a phase frequency detector for receiving a clock signal from a reference clock;
    a feed-forward charge pump and a main charge pump for receiving signals from said phase frequency detector;
    a voltage-controlled oscillator, for receiving signals from said feed-forward charge pump and said main charge pump, includes
        a first tri-path inverter having a first self-voting inverter, a second self-voting inverter and a third self-voting inverter;
        a second tri-path inverter connected to said first tri-path inverter, wherein said second tri-path inverter includes a fourth self-voting inverter, a fifth self-voting inverter and a sixth self-voting inverter; and
        a third tri-path inverter connected to said first and second tri-path inverters to provide feedback for oscillations, wherein said third tri-path inverter includes a seventh self-voting inverter, an eighth self-voting inverter and a ninth self-voting inverter;
    a forward frequency divider for providing output signals for said phase-lock loop circuit; and
    a feedback frequency divider for returning said output signals to said phase frequency detector.

8. The phase-lock loop of claim 7, wherein one of said self-voting inverters includes three stages.

9. The phase-lock loop of claim 8, wherein one of said stages includes two PMOS transistors connected in series with two NMOS transistors.

* * * * *